(12) United States Patent
Ma et al.

(10) Patent No.: US 9,225,319 B2
(45) Date of Patent: *Dec. 29, 2015

(54) APPARATUS AND METHODS FOR ALTERING THE TIMING OF A CLOCK SIGNAL

(71) Applicant: Micron Technology, Inc., Boise, ID (US)

(72) Inventors: Yantao Ma, Boise, ID (US); Aaron Willey, Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/172,441

(22) Filed: Feb. 4, 2014

(65) Prior Publication Data
US 2014/0152361 A1 Jun. 5, 2014

Related U.S. Application Data

(63) Continuation of application No. 13/151,974, filed on Jun. 2, 2011, now Pat. No. 8,643,418.

(51) Int. Cl.
H03K 5/12 (2006.01)
H03K 5/01 (2006.01)
H03K 19/003 (2006.01)

(52) U.S. Cl.
CPC ............ H03K 5/01 (2013.01); H03K 19/00361 (2013.01); H03K 19/00369 (2013.01)

(58) Field of Classification Search
USPC .................................................. 327/170, 165
See application file for complete search history.

(56) References Cited

U.S. PATENT DOCUMENTS

| 4,727,266 | A | * | 2/1988 | Fujii et al. | 326/27 |
|---|---|---|---|---|---|
| 4,988,897 | A | * | 1/1991 | Jeong | 326/71 |
| 5,341,045 | A | * | 8/1994 | Almulla | 326/68 |
| 5,430,393 | A | * | 7/1995 | Shankar et al. | 327/142 |
| 5,434,525 | A | * | 7/1995 | Leonowich | 327/278 |
| 5,453,709 | A | | 9/1995 | Tanimoto et al. | |
| 5,532,620 | A | * | 7/1996 | Seo et al. | 326/81 |
| 5,600,267 | A | * | 2/1997 | Wong et al. | 326/73 |
| 5,731,727 | A | | 3/1998 | Iwamoto et al. | |
| 5,959,481 | A | * | 9/1999 | Donnelly et al. | 327/170 |
| 5,973,533 | A | | 10/1999 | Nagaoka | |
| 6,046,620 | A | * | 4/2000 | Relph | 327/277 |
| 6,144,240 | A | | 11/2000 | MacQuigg | |
| 6,392,453 | B1 | * | 5/2002 | Morzano et al. | 327/108 |
| 6,518,808 | B2 | * | 2/2003 | Shimoda | 327/172 |
| 6,680,634 | B1 | * | 1/2004 | Ruha et al. | 327/158 |
| 6,686,785 | B2 | * | 2/2004 | Liu et al. | 327/158 |
| 6,897,696 | B2 | | 5/2005 | Chang | |
| 6,967,514 | B2 | | 11/2005 | Kizer et al. | |
| 7,095,265 | B2 | * | 8/2006 | Nguyen et al. | 327/293 |

(Continued)

Primary Examiner — Ryan Jager
(74) Attorney, Agent, or Firm — Dorsey & Whitney LLP

(57) ABSTRACT

Clock signal timing cells, clock signal timing circuits, clock circuits, memory devices, systems, and method for altering the timing of a clock signal are disclosed. An example method for altering the timing of an output signal provided responsive to an input clock signal includes adjusting a transition of an edge of the output signal from one voltage level to another based at least in part on a bias signal. An example clock signal timing cell includes an inverter and a bias controlled inverter coupled in parallel to the inverter. The bias controlled circuit is configured to provide an output signal wherein a transition of a clock edge of the output signal between first and second voltage levels is based at least in part on a bias signal.

16 Claims, 7 Drawing Sheets

(56) References Cited

U.S. PATENT DOCUMENTS

| | | |
|---|---|---|
| 7,449,920 B2 * | 11/2008 | Papanikolaou et al. ......... 326/86 |
| 7,528,641 B2 | 5/2009 | Kuramori |
| 7,548,101 B2 | 6/2009 | Shim |
| 7,741,866 B2 * | 6/2010 | Krishnan et al. ................ 326/30 |
| 8,643,418 B2 * | 2/2014 | Ma et al. ........................ 327/170 |
| 2010/0156488 A1 | 6/2010 | Kim et al. |
| 2010/0279645 A1 | 11/2010 | Scott et al. |
| 2012/0306554 A1 * | 12/2012 | Ma et al. ........................ 327/165 |

* cited by examiner

US 9,225,319 B2

APPARATUS AND METHODS FOR ALTERING THE TIMING OF A CLOCK SIGNAL

CROSS-REFERENCE TO RELATED APPLICATION

This application is a continuation of U.S. patent application Ser. No. 13/151,974, filed Jun. 2, 2011, U.S. Pat. No. 8,643,418 issued on Feb. 4, 2014. This application and patent are incorporated by reference herein in their entirety and for all purposes.

TECHNICAL FIELD

Embodiments of the present invention relate generally to semiconductor memory and, more specifically, in one or more illustrated embodiments, to apparatus and methods for altering the timing of clock signals.

BACKGROUND OF THE INVENTION

Memory devices typically include a plurality of memory cells, which may be arranged in an array of intersecting rows and columns. Read and write operations, to respectively store and retrieve memory contents, may involve multiple steps and accessing multiple memory cells at approximately the same time. One or more clock signals can serve to synchronize activities in a memory device. Such clock signals can be distributed throughout the memory device through its clock distribution network. Various components of a clock path, for example clock drivers and delay cells of a delay line, can be sensitive to variations in supply voltage and/or current used to power the memory device. Clock path constituents can differ in their sensitivity to supply variations.

Memory devices are commonly powered by a variety of means. In some cases, the circuits are powered solely from an external source coupled to a power supply terminal. Memory device suppliers can specify minimum and maximum supply voltage and/or current (i.e., operating parameters) for proper operation of the memory device. Even within specified operating parameters, components of a clock path may exhibit different levels of sensitivity to supply variations sufficient to cause time variation (or jitter) of the clock signal and outputs.

Circuits in the clock path that include a chain of delay cells, for example, delay-lock loops, duty cycle correction circuits, and other delay circuits, may introduce significant jitter resulting from power supply variations because each delay cell may add a time variation. Whereas the jitter introduced by each delay cell may not be significant, the sum of the time variations contributed by all of the delay cells may be enough to cause problems in operation.

Accordingly, it is desirable to reduce clock jitter arising from variations in supply voltage and/or current.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. Various embodiments of circuits, devices, and systems according to the invention may be generally referred to as an apparatus or apparatuses. In other instances, well-known circuits, control signals, timing protocols, and software operations have not been shown in detail in order to avoid unnecessarily obscuring the invention.

Figure 1:
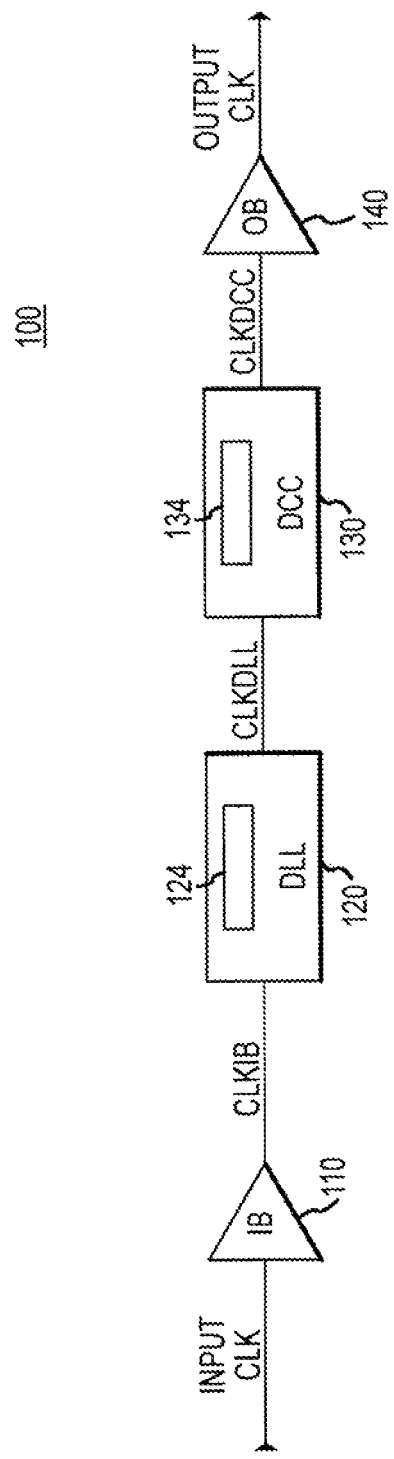
FIG. 1 is a block diagram of a clock circuit including a bias controlled clock timing cell according to an embodiment of the invention.

FIG. 1 illustrates a clock circuit 100 according to an embodiment of the invention. The clock circuit 100 includes an input buffer 110 configured to buffer an input clock signal INPUT CLK and provide a buffered clock signal CLKIB. The CLKIB signal is provided to a delay-lock loop (DLL) 120. The DLL 120 includes a delay 124 that is configured to provide a delay to the CLKIB in providing a delayed clock signal CLKDLL. The CLKDLL signal is provided to a duty cycle correction (DCC) circuit 130 that is configured to correct a duty cycle of the CLKDLL signal. The DCC includes a delay 134 that delays the CLKDLL signal in correcting the duty cycle. The DCC provides a duty cycle corrected clock signal CLKDCC to an output buffer 140 that buffers the CLKDCC signal and provides an output clock signal OUTPUT CLK. Although shown in FIG. 1 as following the DLL 120, the DCC 130 may precede the DLL 120 in other embodiments and provide a duty cycle corrected clock signal to be synchronized by the DLL 120.

The amount of delay provided by the delays 124 and 134 may be adjustable to provide a range of timing delay to an input clock signal. As will described in more detail below, the delays 124 and 134 may include clock timing cells configured to delay the respective clock signal by altering the timing of the signal it receives to provide the respective output signal. The degree the timing of the clock signals are altered may be used to adjust the amount of timing delay.

Figure 2A:
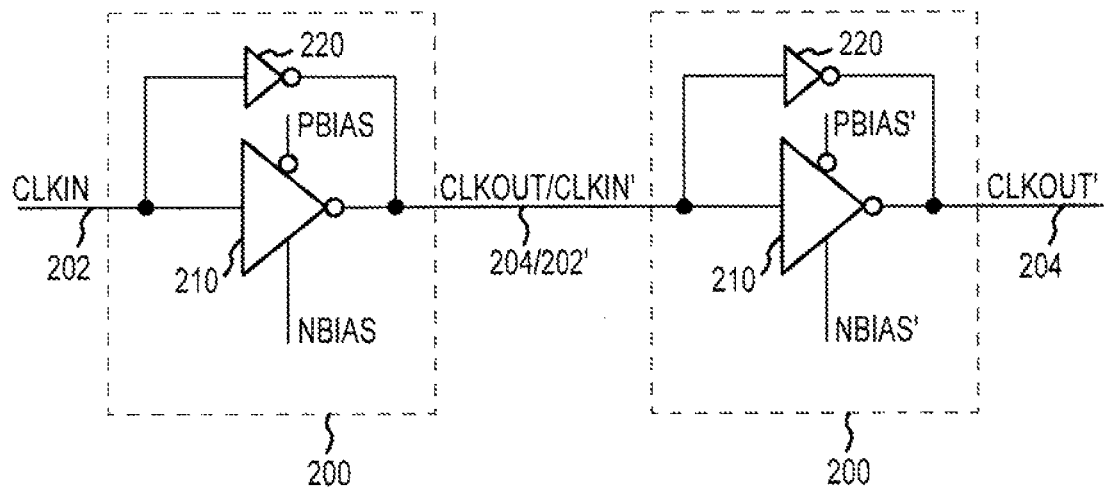
FIGS. 2A and 2B are block diagrams of bias controlled clock timing cells according to an embodiment of the invention.
Figure 2B:
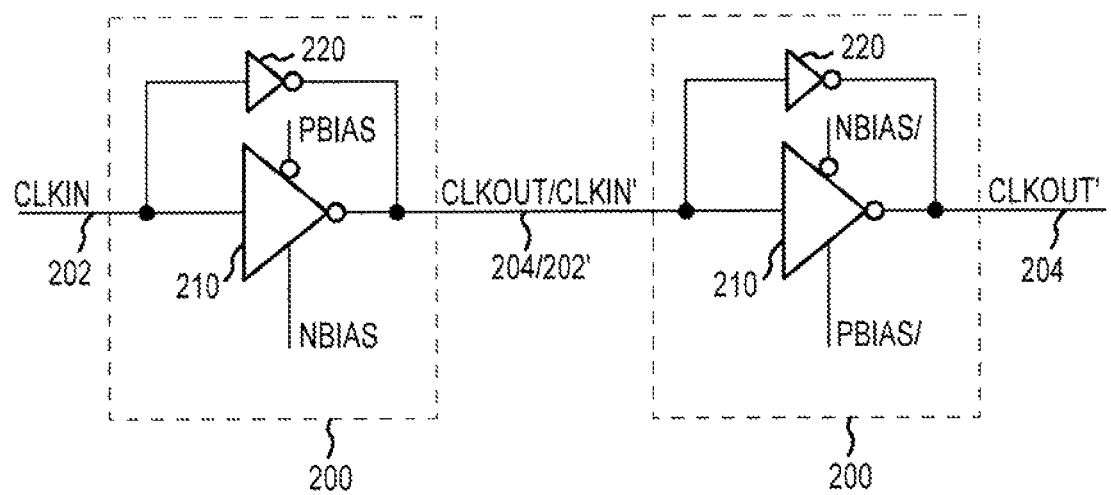

FIGS. 2A and 2B illustrate series coupled bias controlled clock timing cells 200 according to various embodiments of the invention. The clock timing cell 200 may be included in the delay 124 of the DLL 120 and/or may be included in the delay 134 of the DCC 130. Each clock timing cell 200 is configured to alter the timing of an input clock signal in providing an output signal, examples include altering a duty cycle of the input clock signal, providing a delay to the input clock signal, or combinations thereof. Control over the clock timing cell 200 is based at least in part on bias signals.

The bias controlled clock timing cell 200 includes a bias controlled inverter 210 and an inverter 220 coupled in parallel between input node 202 and output node 204. Bias signals PBIAS and NBIAS are provided to bias controlled inverter 210 to alter the timing of an output clock signal CLKOUT relative to an input signal CLKIN provided to the input node 202. The timing cell 200 alters the timing of the CLKOUT signal based at least in part on the PBIAS signal and the NBIAS signal. Altering the timing may be performed by adjusting the transition of a clock edge of an output clock signal CLKOUT from one voltage level to another based on the bias signal. For example, adjusting the rate at which rising and falling dock edges of an output signal CLKOUT change from one voltage level to another. That is, a slower rate may in effect add delay and/or change the duty cycle of the CLKOUT signal provided at the output node 204 by the clock timing cell 200. The rate at which the CLKOUT signal changes from one voltage level to another may be adjusted by adjusting a drive strength of the clock timing cells 200, a greater drive strength for a faster rate and a lower drive strength for a slower rate. In some embodiments, the drive strength of the bias controlled inverter 210 may be adjusted by the PBIAS and NBIAS signals. Comparatively, the inverter 220 is a relatively weak inverter that prevents the clock edges from collapsing at extreme cases of where the bias controlled inverter 210 is biased in such a way that it cannot maintain the output signal at one or the other voltage level.

As illustrated in the embodiment of FIG. 2A, bias controlled clock timing cells 200 may be coupled in series to provide an overall change to the CLKOUT signal that is provided responsive to the CLKIN signal. In configurations having a plurality of bias controlled clock timing cells 200 coupled in series, the timing of the rising and falling clock edges altered by each clock timing cell 200 may be different. For example, each of the timing cells 200 of a series coupled pair may be configured to favor adjustment of a respective clock edge of the CLKOUT signal. That is, one of the timing cells favors adjustment of a rising clock edge and the other timing cell favors adjustment of a falling clock edge. Each of the timing cells 200 may be controlled differently by providing each one different PBIAS and NBIAS signals. For example, in the embodiment of FIG. 2A, a first set of PBIAS and NBIAS signals are provided to the first timing cell 200 and a second set of PBIAS and NBIAS signals are provided to the second timing cell 200. The first and second sets of PBIAS and NBIAS signals may be different, such as provided by different bias circuits. Each of the timing cells 200 may alter the timing of rising and falling clock edges differently in this manner. In another embodiment of the invention, as shown in FIG. 2B the bias signals provided to the bias nodes of a timing cell 200 may be different than that shown in FIG. 2A to provide different operation. For example, the first timing cell 200 may be provided PBIAS and NBIAS signals to the bias nodes as shown in FIG. 2A, however, the second timing cell 200 may have the complement of the NBIAS signal (i.e., NBIAS/) provided to the inverting bias node and a complement of the PBIAS signal (i.e., PBIAS/) provided to the non-inverting bias node. These signals may be a multi-bit digital signal, as well as analog signals. Each of the timing cells 200 may alter the timing of both rising and falling clock edges in this manner.

In contrast to conventionally designed delays that typically include a plurality of series coupled delay cells, embodiments of the invention may be used to alter the timing of a clock signal, for example, add delay or adjust a duty cycle, over a usable range of timing using one or two bias controlled clock timing cells. Other embodiments of the invention, however, may include more bias controlled clock timing cells than two. However, two or fewer timing cells according to embodiments of the invention may be sufficient. As a result, power supply sensitivity and clock jitter related to the number of delay cells may be reduced due to the use of fewer timing cells according to embodiments of the invention.

Figure 3:
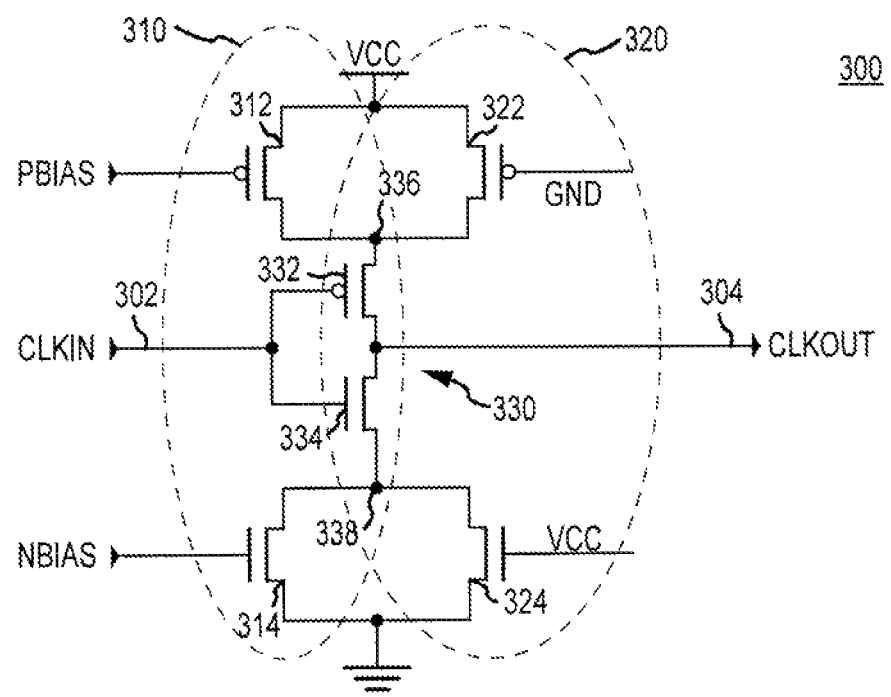
FIG. 3 is a schematic diagram of a bias controlled clock timing cell according to an embodiment of the invention.

FIG. 3 illustrates a bias controlled clock timing cell 300 according to an embodiment of the invention. The clock timing cell 300 may be included in the delay 124 of the DLL 120 and/or may be included in the delay 134 of the DCC 130. The clock timing cell 300 includes a bias controlled inverter 310 and an inverter 320. In the embodiment illustrated in FIG. 3 an inverter circuit 330 including transistors 332 and 334 is shared by the bias controlled inverter 310 and the inverter 320. The transistors 332 and 334 may be p-channel and n-channel field effect transistors (pFET and nFET) coupled to an input node 302 and an output node 304. In addition to the inverter circuit 330, the bias controlled inverter 310 includes transistor 312 coupled between the inverter circuit 330 at node 336 and a voltage supply node and further includes transistor 314 coupled between the inverter circuit 330 at node 338 and a reference supply node providing a reference voltage. The voltage supply node provides a supply voltage, such as VCC, and the reference supply node provides a reference voltage, for example, ground. The transistor 312 is provided a first bias signal PBIAS and the transistor 314 is provided a second bias signal NBIAS. The transistor 312 may be a pFET and the transistor 314 may be an nFET, as illustrated for the embodiment shown in FIG. 3.

The inverter 320 includes in addition to the inverter circuit 330 transistors 322 and 324. The transistor 322 is coupled between the inverter circuit 330 and the voltage supply node and the transistor 324 is coupled between the inverter circuit 330 and the reference voltage node. The transistor 322 may be a pFET and the transistor 324 may be an nFET, as illustrated in the embodiment shown in FIG. 3. In such an embodiment, the transistor 322 may be biased by the reference voltage and the transistor 324 may be biased by the supply voltage during operation.

In operation, the clock timing cell 300 provides an output signal CLKOUT at the output node 304 responsive to an input signal CLKIN provided at the input node 302. The CLKOUT signal may be driven in part by the inverter 320 and in part by the bias controlled inverter 310. With the transistors 322 and 324 biased by the reference voltage and the supply voltage respectively, the supply voltage is provided to node 336 and the reference voltage is provided to node 338, all respectively.

The transistors 322 and 324 are configured to have relatively weak drive strengths compared to the bias controlled inverter 310, and may be included to prevent clock edges of the CLKOUT signal from collapsing at extreme ends of a range over which a drive strength of the bias controlled inverter 310 may be adjusted. The drive strength of the bias controlled bias controlled inverter 310, which adds to the drive strength of the inverter 320, is adjusted by voltages of the PBIAS and NBIAS signals. For example, with reference to the transistor 322, the transistor 312 may be made more conductive by the PBIAS signal to increase the drive strength and thereby cause a rising clock edge of the CLKOUT signal to transition faster from ground to VCC responsive to a CLKIN signal having a low voltage level. Alternatively, the transistor 312 may be made less conductive by the PBIAS signal to decrease the drive strength and thereby cause the rising clock edge of the CLKOUT signal to transition from ground to VCC relatively more slowly. Similarly, the transistor 314 may be made more conductive by the NBIAS signal to increase the drive strength and thereby provide a taster transition for a falling clock edge of the CLKOUT signal or made less conductive to decrease the drive strength and provide a relatively slower transition for the falling clock edge of the CLKOUT signal.

As known, a circuit receiving the CLKOUT signal may have trigger voltages at which that circuit responds to the CLKOUT signal as having a high voltage level or a low voltage level. With control over the rate at which the rising and falling clock edges of the OUT signal may change by adjusting the drive strength of the bias controlled inverter 310, the timing of when a trigger voltage is achieved by the rising and falling clock edges may be shifted over a time range. As a result, timing of the CLKOUT signal may be altered relative to the CLKIN signal.

As illustrated in the previously described embodiment, the timing of the rising and falling clock edges of the CLKOUT signal may be altered independently of one another. In configurations where bias controlled timing cells are coupled in series, within each cell the timing of the rising and falling clock edges may be altered differently. Moreover, the timing of the of the rising and falling clock edges altered by each clock timing cell may be different as well. For example, each of the timing cells of a series coupled pair may be configured to favor adjustment of a respective clock edge of the CLKOUT signal. That is, one of the timing cells favors adjustment of a rising clock edge and the other timing cell favors adjustment of a falling clock edge. Such a configuration may be provided by scaling of the transistors (e.g., transistors 312, 314) to provide the desired adjustment. Timing cells may be added to provide a wider range over which the timing may be altered. In some embodiments, each of the cells coupled in series may have different ranges over which the timing of the CLKOUT signal may be altered, thereby providing coarse and line adjustment of the clock signal timing.

As previously discussed, bias signals are provided to the bias controlled clock timing cells, for example, the bias controlled clock timing cell 200 of FIGS. 2A and 2B, to alter the timing of an input clock signal. Controllable bias circuits may be used to provide the bias signals according to control signals. In some embodiments, the control signals are analog. Digital control signals may be used as well for other embodiments.

Figure 4:
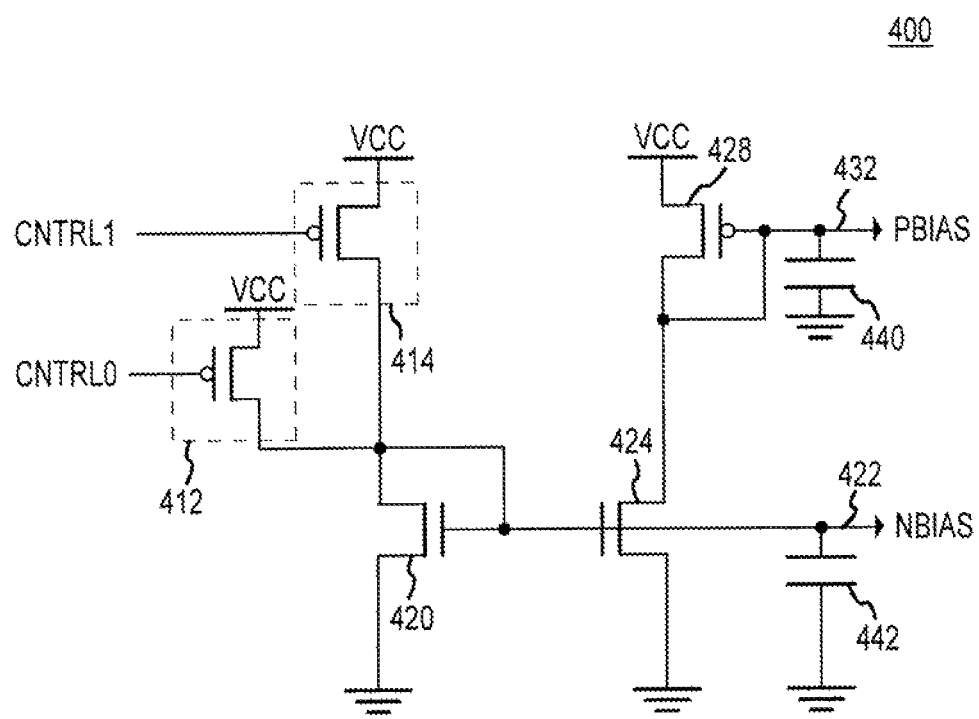
FIG. 4 is a schematic diagram of a bias circuit according to an embodiment of the invention.

FIG. 4 illustrates a bias circuit 400 according to an embodiment of the invention. The bias circuit 400 may be included in the delay 124 of the DLL 120 and may be included in the delay 134 of the DCC 130. The bias circuit 400 may be used to provide bias signals to a bias controlled clock timing cell, for example, the bias controlled clock timing cell 200, also included in the delay. The bias circuit 400 includes a current mirror having control input circuits 412 and 414 coupled to transistor 420. The transistor 420 may be diode-coupled as illustrated in FIG. 4. The control input circuit 412 is configured to receive control signal CNTRL0 and the control input circuit 414 is configured to receive control signal CNTRL1. Although the control input circuit is illustrated in FIG. 4 as including one transistor, the control input circuit 412 may include a plurality of transistors coupled in parallel. Likewise, the control input circuit 414 may include a plurality of transistors as well. In such embodiments, the bias circuit 400 may be digitally controlled to provide bias signals PBIAS and NBIAS. The CNTRL0 and CNTRL1 signals may be multi-bit signals with each bit provided to a respective transistor of the control input circuits. For example, each bit of the CNTRL0 signal may be provided to a respective one of a plurality of transistors of the control input circuit 412 and each bit of the CNTRL1 signal may be provided to a respective one of a plurality of transistors of the control input circuit 414. As a result, the conductivity of particular ones of the plurality of transistors may be controlled.

The CNTRL0, CNTRL1 signals may be provided using conventional circuitry, and may be set during manufacture. For example, conventional fuses/anti-fuses may be used to set the values for the CNTRL0, CNTRL1 signals. The CNTRL0, CNTRL1 signals may also be programmable. For example, the manufacturer or user may program the values for CNTRL0, CNTRL1 to provide PBIAS and NBIAS signals having desired voltages. When used with a bias controlled clock timing cell, the programmability allows for the degree to which the timing of a CLKOUT signal is altered to be programmable.

The transistor 420 provides the NBIAS signal at NBIAS output 422. The transistor 420 is further coupled to transistor 424, which is adjusted by the NBIAS signal to control current through transistor 428. The transistor 428 provides the PBIAS signal at PBIAS output 432. Capacitances 440 and 442 may be coupled to PBIAS and NBIAS outputs 432, 422, respectively, to provide filtering of the PBIAS and NBIAS signals. The capacitances 440, 442, however, may not be included in other embodiments of the bias circuit.

In operation, the CNTRL0 and CNTRL1 signals are provided to the control input circuits 412, 414 to set a current through the respective control input circuit. As previously discussed, each bit of multi-bit CNTRL0, CNTRL1 signals may be applied to a respective one of a plurality of transistors included in each of the control input circuits 412, 414. For example, where the CNTRL0 signal is a multi-bit value having one bit equal to a low logic level, the transistor coupled to receive the one low logic level bit will be conductive. In contrast, where the CNTRL0 signal has all bits equal to a low logic level, all of the transistors of the control input circuit 412 will be conductive and will provide the most current through the control input circuit 412. Other configurations of control input circuits 412, 414, and other control configuration and control signal decoding schemes may be used as well. The resulting current through the control input circuits 412, 414 set the voltage of the NBIAS signal. The NBIAS voltage provided by the transistor 420 at the NBIAS output 422 is based at least in part on the sum of the currents through the control input circuits 412, 414, which is responsive to the CNTRL0 and CNTRL1 signals. The NBIAS voltage further sets a conductivity of the transistor 424, which in turn establishes a current through the transistor 428. The current through transistor 428 sets the PBIAS voltage provided at the PBIAS output 432.

As illustrated by the previous description, the PBIAS and NBIAS voltages may be adjusted based on the values of the CNTRL0 and CNTRL1 signals. The adjustable PBIAS and NBIAS signals may be used to bias a bias controlled clock timing cell, for example, timing cells 200 and 300 to alter the timing of a CLKOUT signal provided responsive to a CLKIN signal.

In some embodiments, two bias circuits, such as bias circuit 400 are used with a pair of series coupled bias controlled clock timing cells (e.g., as illustrated in FIGS. 2A and 2B). In contrast to having each bias circuit providing the PBIAS and NBIAS signals to a respective timing cell, each bias circuit in the alternative embodiments may be coupled to provide one of the PBIAS and NBIAS signals to a first one of the timing cells and the other bias signal to a second one of the pair of timing cells. Each of the timing cells may be configured to favor altering of the timing of a respective clock edge of the CLKOUT signal. For example, a first one of the pair favors altering the timing of a rising clock edge of the CLKOUT signal and the second one of the pair favors altering the timing of a falling clock edge of the CLKOUT signal. A first one of the bias circuits provides a PBIAS signal to the first timing cell and provides an NBIAS signal to the second timing cell; a second one of the bias circuits provides a PBIAS signal to the second timing cell and provides an NBIAS signal to the first timing cell. In such embodiments, each of the bias circuits may be configured to have different resolutions of alteration or different step sizes. As a result, the resolution and/or range of alteration of the timing of each clock edge of the CLKOUT signal may be different and may be tailored as desired.

Figure 5:
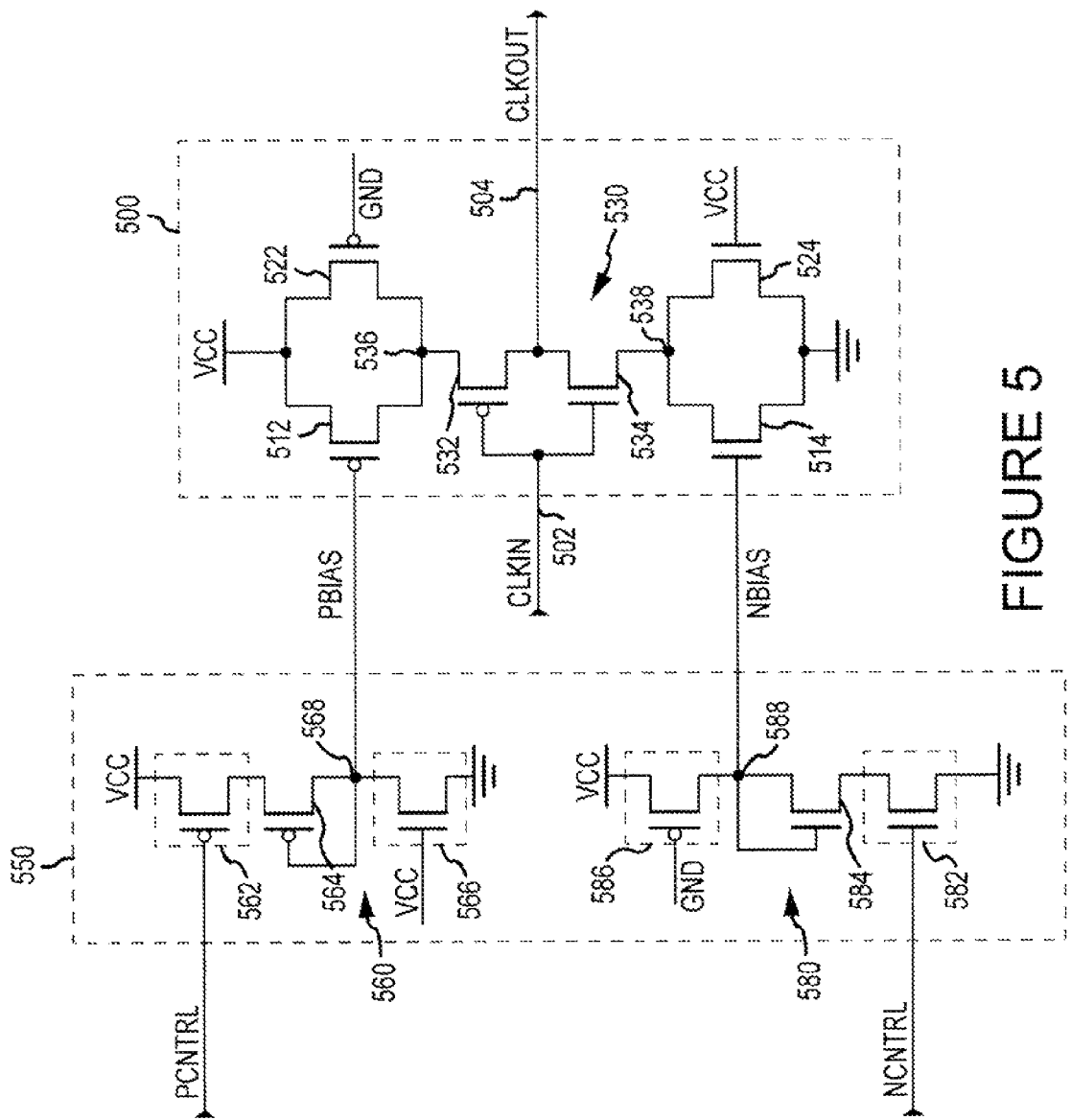
FIG. 5 is a schematic diagram of a bias controlled clock timing cell and bias circuit according to an embodiment of the invention.

FIG. 5 illustrates a bias controlled clock timing cell 500 and bias circuit 550 according to an embodiment of the invention. The clock timing cell 500 and bias circuit 550 may be included in the delay 124 of the DLL 120 and/or may be included in the delay 134 of the DCC 130. The timing cell 500 is configured to alter the timing of a CLKOUT signal relative to a CLKIN signal based at least in part on bias signals PBIAS and NBIAS. The timing cell 500 includes an inverter circuit 530 including transistors 532 and 534. The transistors 532 and 534 are coupled to an input node 502 and an output node 504. Transistor 512 is coupled between the inverter circuit 530 at node 536 and a voltage supply node and transistor 514 is coupled between the inverter circuit 530 at node 538 and a reference supply node providing a reference voltage. The voltage supply node provides a supply voltage (e.g., VCC) and the reference supply node provides a reference voltage (e.g., ground). The transistor 512 is provided the PBIAS signal and the transistor 514 is provided the NBIAS signal. The timing cell 500 may further include transistors 522 and 524. In some embodiments, the transistors 522 524 are not included. In such embodiments, the widest range of timing alteration may be provided by the timing cell 500. The transistor 522 may be coupled between the inverter circuit 530 and the voltage supply node and the transistor 524 is coupled between the inverter circuit 530 and the reference supply node. The transistor 522 may be biased by the reference voltage and the transistor 524 may be biased by the supply voltage during operation.

The bias circuit 550 includes a PBIAS signal circuit 560 and an NBIAS signal circuit 580. The PBIAS signal circuit 560 is configured to provide a PBIAS signal to the timing cell 500 based at least in part on control signal PCNTRL and the NBIAS signal circuit 580 is configured to provide an NBIAS signal to the timing cell 500 based at least in part on control signal NCNTRL. The PCNTRL and NCNTRL signals may be in some embodiments multi-bit signals or in other embodiments, the PCNTRL and NCNTRL signals may be analog signals. For example, the PCNTRL and NCNTRL signals may be multi-bit signals in digital logic implementations, and may be analog signals in analog circuit designs.

The PBIAS signal circuit 560 includes control input circuit 562 series coupled to transistor 564 and impedance circuit 566 between a voltage supply node and a voltage reference node. The transistor 564 may be diode-coupled as illustrated in FIG. 5. The voltage supply node provides a supply voltage (e.g., VCC) and the voltage reference node provides a reference voltage (e.g., ground). The impedance circuit 566 is illustrated in FIG. 5 as including a nFET having a gate coupled to the voltage supply. Other circuits may be used for the impedance circuit 566 as well. For example, in some embodiments a diode-coupled nFET may be used to provide greater impedance than the voltage supply coupled nFET in the embodiment of FIG. 5.

The conductivity of the control input circuit 562 is controlled at least in part by the PCNTRL signal. The PBIAS signal is provided by the PBIAS signal circuit 560 at PBIAS output node 568 to the timing cell 500. The control input circuit 562 is illustrated in FIG. 5 as including one pFET configured to receive the PCNTRL signal, however, the control input circuit 562 may include a plurality of pFETs coupled in parallel. For example, in some embodiments the control input circuit 562 includes a plurality of pFETs, each configured to receive a respective bit signal of a multi-bit PCNTRL signal.

The NBIAS signal circuit 580 includes control input circuit 582 series coupled to transistor 584 and impedance circuit 586 between the voltage supply node and the voltage reference node. The impedance circuit 586 is illustrated in FIG. 5 as a pFET having a gate coupled to the reference supply. Other circuits may be used for the impedance circuit 586 as well. For example, in some embodiments a diode-coupled pFET may be used to provide greater impedance than the reference supply coupled pFET in the embodiment of FIG. 5.

The conductivity of the control input circuit 582 is controlled at least in part by the NCNTRL signal. The NBIAS signal is provided by the NBIAS signal circuit 580 at NBIAS output node 588 to the timing cell 500. The control input circuit 582 is illustrated in FIG. 5 as including one nFET configured to receive the NCNTRL signal, however, the control input circuit 582 may include a plurality of pFETs coupled in parallel. For example, in some embodiments the control input circuit 582 includes a plurality of nFETs, each configured to receive a respective bit signal of a multi-bit NCNTRL signal.

In operation, the PCNTRL signal is used to set the conductivity (which could, in some embodiments, be inversely effectuated by setting the impedance) of the control input circuit 562, which in turn sets the current through the PBIAS signal circuit 560. The resulting voltage at the PBIAS output node 568 will generally be the product of the supply voltage (e.g., VCC) and the ratio of the impedance of the impedance circuit 566 and the total impedance of the control input circuit 562, transistor 564 and impedance circuit 566. Thus, changing the conductivity of the control input circuit 562 will result in a change of the voltage of the PBIAS signal provided at PBIAS output node 568. As previously described, the control input circuit 582 may be configured to receive a multi-bit PCNTRL signal and have a conductivity based on the bits of the PCNTRL signal. For example, the control input circuit 562 may include a plurality of pFET transistors coupled in parallel with each pFET coupled to receive a respective bit signal of the PCNTRL signal. Other configurations off the control input circuit 562 and PCNTRL decoding schemes may be used as well.

Likewise, the NCNTRL signal is used to set the conductivity (which could, in some embodiments, be inversely effectuated by setting the impedance) of the control input circuit 584. As a result, the current through the NBIAS signal circuit 580 will be adjusted and in turn adjust the voltage of the NBIAS signal. Generally, the voltage of the NBIAS signal will be the product of the supply voltage and the ratio of the impedance of the control input circuit 582 and the transistor 584 and the total impedance of the control input circuit 582, transistor 584, and impedance circuit 586. Changing the impedance of the control input circuit 582 will result in a change of the voltage of the NBIAS signal. As with the PBIAS input control circuit 562, the NBIAS control input circuit 582 may be configured to receive a multi-bit NCNTRL signal and be adjusted accordingly. For example, the NBIAS control circuit 582 may include a plurality of nFET transistors coupled in parallel with each nFET coupled to receive a respective bit signal of the NCNTRL signal. Other configurations of the control input circuit 582 and NCNTRL decoding schemes may be used as well.

By adjusting the voltages of the PBIAS and NBIAS signals, the drive strength of the bias controlled clock timing cell 500 may be adjusted, which can be used to alter the timing of a CLKOUT signal provided responsive to a CLKIN signal.

For example, a rising clock edge drive strength may be adjusted based at least in part on the PBIAS signal provided to the transistor 512. The PBIAS signal may set the conductivity of the transistor 512 and change the current available to drive a rising clock edge. Similarly, a falling clock edge drive strength may be adjusted based at least in part on the NBIAS signal provided to the transistor 514. The NBIAS signal may set the conductivity of the transistor 514 and change the rate of current discharge available to drive a falling clock edge. As previously discussed, the transistors 522 and 524 may be included and have relatively weak drive strength. The transistors 522 and 524 may be used to prevent the CLKOUT signal from collapsing in conditions where the transistors 512 and 514 do not provide sufficient drive for the inverter circuit 530 to prevent clock edges of the CLKOUT signal from collapsing.

The bias controlled clock timing cell 500 and the bias circuit 550 may be used in a configuration of two series coupled timing cells 500. In such an embodiment, each of the bias controlled clock timing cells may be configured to favor altering the timing on a respective clock edge. For example, a first timing cell may be adjusted so that timing for a rising clock edge is altered using the PCNTRL signal while a falling clock edge for the timing cell is driven with maximum drive strength. The second timing cell may be adjusted so that timing for either a falling or a rising clock edge is altered using the NCNTRL signal while the rising or falling clock edge is driven with a maximum drive strength.

Figure 6:
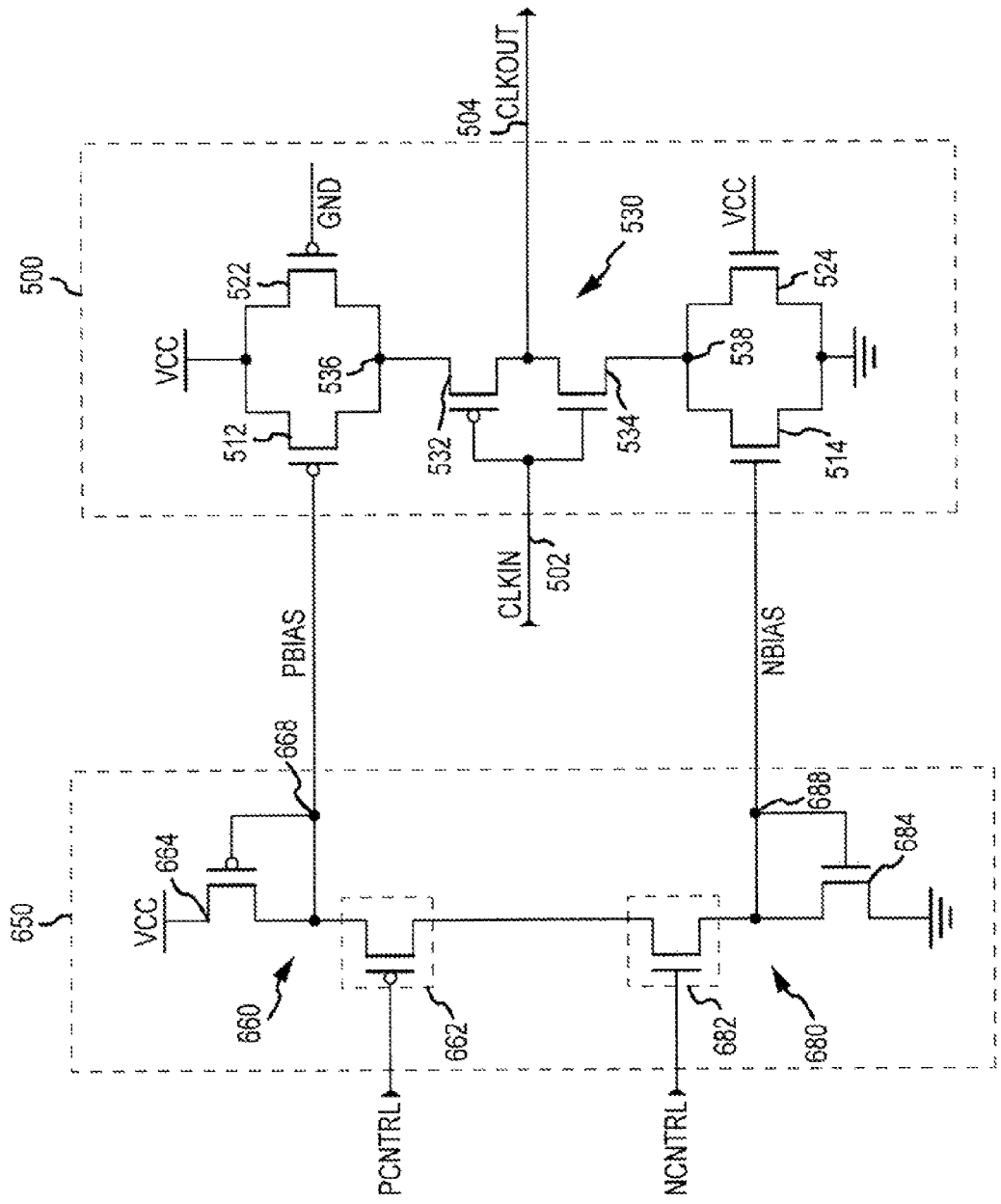
FIG. 6 is a schematic diagram of a bias controlled clock timing cell and bias circuit according to an embodiment of the invention.

FIG. 6 illustrates the bias controlled clock timing cell 500 and bias circuit 650 according to an embodiment of the invention. The clock timing cell 500 and bias circuit 650 may be included in the delay 124 of the DLL 120 and/or may be included in the delay 134 of the DCC 130. The timing cell 500 is configured to alter the timing of a CLKOUT signal relative to a CLKIN signal based at least in part on bias signals PBIAS and NBIAS provided by the bias circuit 650. The timing cell 500 is configured similarly as previously discussed with reference to FIG. 5. Reference numbers previously used in FIG. 5 are used in FIG. 6 as well to identify similar elements previously described with reference to FIG. 5. In the interest of brevity, the description for the bias controlled clock timing cell 500 will not be repeated with reference to FIG. 6.

The bias circuit 650 includes a PBIAS signal circuit 660 configured to provide a PBIAS signal and thither includes a NBIAS signal circuit 680 configured to provide a NBIAS signal. The PBIAS signal circuit 660 includes a transistor 668 coupled to a voltage supply node and a control input circuit 662. The NBIAS signal circuit 680 includes a transistor 688 coupled to a reference supply node and a control input circuit 682. The voltage supply node provides a supply voltage (e.g., VCC) and the voltage reference node provides a reference voltage (e.g., ground). The transistor 668 as shown in the embodiment of FIG. 6 may be diode-coupled. The transistor 668 provides the PBIAS signal to the bias controlled clock timing cell 500. The transistor 688 as shown in the embodiment of FIG. 6 may be diode-coupled. The transistor provides the NBIAS signal to the bias controlled clock timing cell 500. The control input circuit 662 is provided a PCNTRL signal and the control input circuit 682 is provided a NCNTRL signal. The respective control signals may be used to control the voltage level of the PBIAS and NBIAS signals provided to the timing cell 500. In some embodiments of the invention, the control input circuit 662 is coupled to a source of the transistor 668 and the voltage supply node rather than to a drain of the transistor 668, and the control input circuit 682 is coupled to a source of transistor 688 and the reference supply node rather than a drain of the transistor 688.

The control input circuit 662 is illustrated in FIG. 6 as including one pFET configured to receive the PCNTRL signal, however, the control input circuit 662 may include a plurality of pFETs in other embodiments. Similarly, the control input circuit 682 is illustrated in FIG. 6 as including one nFET configured to receive the NCNTRL however, the control input circuit 682 may include a plurality of nFETs, for example, coupled in parallel with each nFET receiving a respective signal representing a bit of a multi-bit NCNTRL signal.

In operation, the PCNTRL and NCNTRL signals may be used to adjust a voltage of the PBIAS and NBIAS signals. The PCNTRL signal sets a conductivity of the control input circuit 662 and the NCNTRL signal sets a conductivity of the control input circuit 682. As a result, the current through the PBIAS and NBIAS signal circuits 660, 680 can be adjusted through the PCNTRL and NCNTRL signals. The transistors 664 and 684 are configured, for example, diode-coupled, to have an impedance based on the current. Generally, a voltage of the PBIAS signal will be the product of the supply voltage (e.g., VCC) and a ratio of the impedance of the control input circuit 662, control input circuit 682, and transistor 684 and the total impedance of the PBIAS signal circuit 660 and the NBIAS signal circuit 680. Changing the conductivity (which can be inversely effectuated by changing the impedance) of the control input circuit 662 using the PCNTRL signal will as a result change the voltage of the PBIAS signal. The voltage of the NBIAS signal is generally the product of the supply voltage and a ratio of the impedance of the transistor 684 and the total impedance of the PBIAS signal circuit 660 and the NBIAS signal circuit 680. Changing the conductivity of the control input circuit 682 using the PCNTRL signal will result in a change of the voltage of the NBIAS signal.

The drive strength of the bias controlled clock timing cell 500 may be adjusted by adjusting the voltage of the PBIAS and NBIAS signals, as previously described with reference to the bias controlled clock timing cell 500 and bias circuit 550 of FIG. 5. That is, a rising clock edge drive strength may be adjusted based at least in part on the PBIAS signal provided to the transistor 512 and a falling clock edge drive strength may be adjusted based at least in part on the NBIAS signal provided to the transistor 514. As a result, the timing of a CLKOUT signal provided responsive to a CLKIN signal may be altered by using the PCNTRL and NCNTRL signals.

The bias controlled clock timing cell 500 and the bias circuit 650 may be used in a configuration of two series coupled timing cells 500. In such an embodiment, each of the bias controlled clock timing cells may be configured to favor altering the timing on a respective clock edge. For example, a first timing cell may be adjusted so that timing for a rising clock edge is altered using the PCNTRL signal while a falling clock edge for the timing cell is driven with maximum drive strength. The second timing cell may be adjusted so that timing for a falling clock edge is altered using the NCNTRL signal while the rising clock edge is driven with a maximum drive strength.

Figure 7:
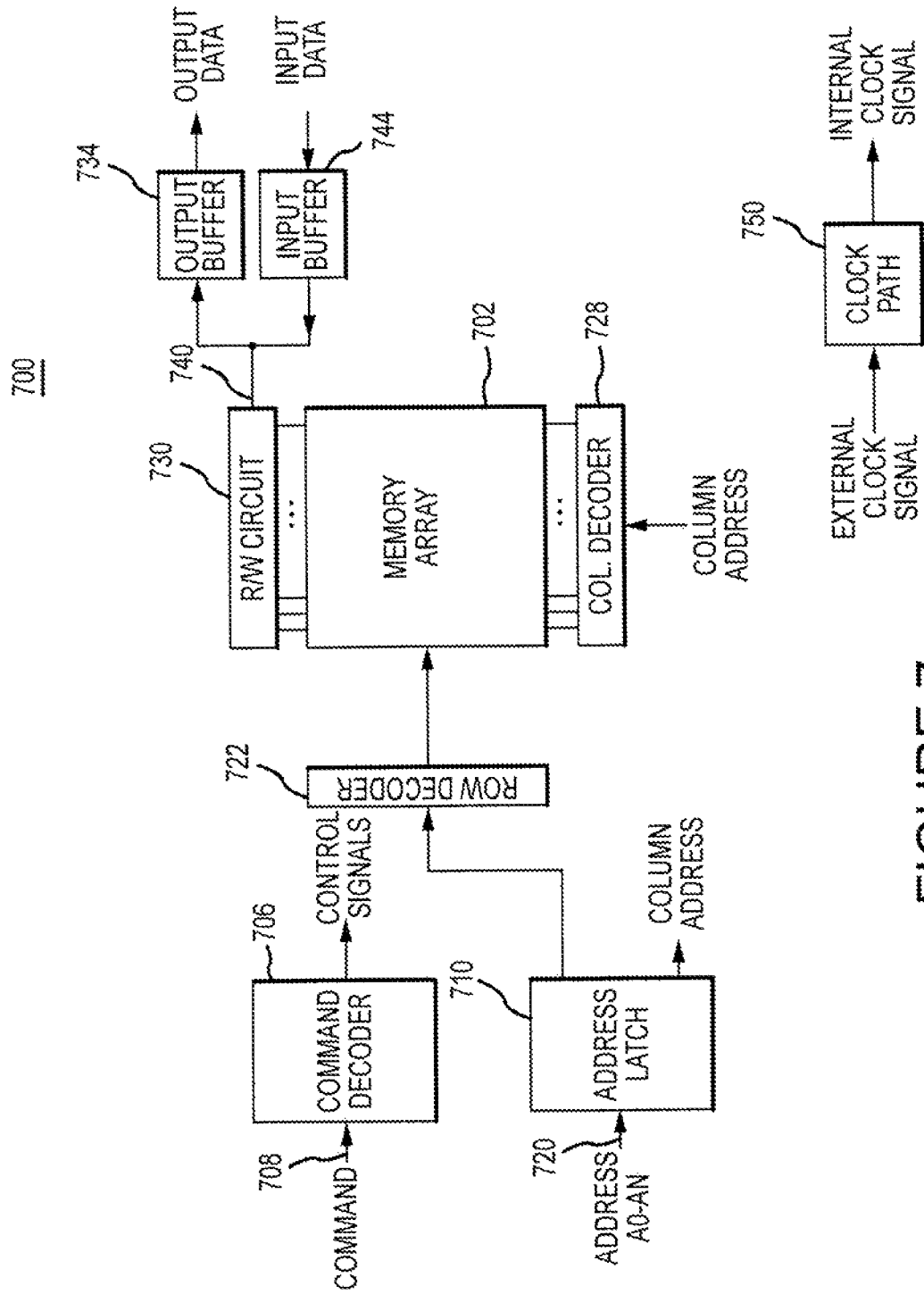
FIG. 7 is a block diagram of a memory including a bias controlled clock timing cell according to an embodiment of the invention.

FIG. 7 illustrates a memory according to embodiments of the present invention. The memory 700 includes an array 702 of memory cells, which may be, for example, DRAM memory cells, SRAM memory cells, flash memory cells, or some other type of memory cells. The memory 700 includes a command decoder 706 that receives memory commands through a command bus 708 and generates corresponding control signals within the memory 700 to carry out various memory operations. The command decoder 706 responds to memory commands applied to the command bus 708 to perform various operations on the memory array 702. For example, the command decoder 706 is used to generate internal control signals to read data from and write data to the memory array 702. Row and column address signals are applied to the memory 700 through an address bus 720 and provided to an address latch 710. The address latch then outputs a separate column address and a separate row address.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output buffer 734 via an input-output data bus 740. Write data are applied to the memory array 602 through a data input buffer 744 and the memory array read/write circuitry 730.

Clock path 750 is configured to receive an external clock signal and provide a synchronized internal clock signal and minimize power supply induced jitter in accordance with embodiments of the present invention. An embodiment of clock path 750 is represented by clock circuit 100 of FIG. 1. The clock signal path 750 may provide one or more clock signals to one or more of the command decoder 706, address latch 710, and input/output circuits such as read/write circuitry 730, data output buffer 744, and input buffer 744 to facilitate, for example, the latching of command, address, and data signals in accordance with the external clock.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
   receiving an input clock signal at a first bias controlled inverter and a first inverter, the first inverter having a lower drive strength than the first bias controlled inverter;
   adjusting, at the first bias controlled inverter, a transition of an edge of an intermediate clock signal from a first voltage level to a second voltage level based at least in part on adjusting a conductivity of a first transistor, wherein the conductivity of the first transistor is adjusted based at least in part on a set of first bias signals, and wherein the intermediate clock signal is provided responsive to the input clock signal;
   providing the intermediate clock signal at an output of the first inverter and the first bias controlled inverter to a second bias controlled inverter and a second inverter;
   adjusting, at the second bias controlled inverter, a transition of an edge of an output clock signal from the second voltage level to the first voltage level based at least in part on adjusting a conductivity of a second transistor, wherein the conductivity of the second transistor is adjusted based at least in part on a set of second bias signals, wherein the output clock signal is provided responsive to the intermediate clock signal, and wherein the set of second bias signals is different than the set of first bias signals; and
   generating the set of first bias signals and the set of second bias signals based at least in part on a multi-bit control signal.

2. The method of claim 1, wherein adjusting the transition of an edge of the intermediate clock signal comprises adjusting a drive strength of the first bias controlled inverter.

3. The method of claim 2, wherein the first transistor is coupled to a supply voltage in the first bias controlled inverter.

4. The method of claim 2, wherein the second transistor is coupled to a reference voltage in the second bias controlled inverter.

5. The method of claim 1, wherein adjusting the edge of the intermediate clock signal comprises adjusting a rising edge of the intermediate clock signal and wherein adjusting the edge of the output clock signal comprises adjusting a falling edge of the output clock signal.

6. A method, comprising:
   receiving an input clock signal at a first bias controlled inverter and a first inverter, the first inverter having a lower drive strength than the first bias controlled inverter;
   adjusting, at the first bias controlled inverter, a transition of an edge of an intermediate clock signal from a first voltage level to a second voltage level based at least in part on adjusting a conductivity of a first transistor, wherein the conductivity of the first transistor is adjusted based at least in part on a set of first bias signals, and wherein the intermediate clock signal is provided responsive to the input clock signal;
   providing the intermediate clock signal at an output of the first inverter and the first bias controlled inverter to a second bias controlled inverter and a second inverter;
   adjusting, at the second bias controlled inverter, a transition of an edge of an output clock signal from the second voltage level to the first voltage level based at least in part on adjusting a conductivity of a second transistor, wherein the conductivity of the second transistor is adjusted based at least in part on a set of second bias signals, wherein the output clock signal is provided responsive to the intermediate clock signal, and wherein the set of second bias signals is different than the set of first bias signals; and
   generating the set of first bias signals and the set of second bias signals based at least in part on a multi-bit control signal, wherein each bit of the multi-bit control signal is configured to control a respective transistor in the first bias controlled inverter.

7. A method comprising:
   adjusting, at a first clock signal timing cell, a rising clock edge transition of an intermediate clock signal from a first voltage level to a second voltage level based at least in part on adjusting a conductivity of a first transistor coupling a first inverter circuit to a supply voltage, wherein adjusting the conductivity of the first transistor is based at least in part on a first set of bias signals, the intermediate clock signal provided responsive to the input clock signal;
   adjusting a falling clock edge transition of the intermediate clock signal from the second voltage level to the first voltage level based at least in part on a third set of bias signals;
   adjusting, at a second clock signal timing cell, a falling clock edge transition of an output clock signal from the second voltage level to the first voltage level based at least in part on adjusting a conductivity of a second transistor coupling a second inverter circuit to a reference voltage, wherein adjusting the conductivity of the second transistor is based at least in part on a second set of bias signals, the output clock signal provided responsive to the intermediate clock signal, wherein the second set of bias signals are different than the first set of bias signals; and adjusting a rising clock edge transition of the output clock signal from the first voltage level to the second voltage level based at least in part on a fourth set of bias signals.

8. The method of claim 7, further comprising:
receiving the first set of bias signals at the first clock signal timing cell from a first bias circuit; and
receiving a complement of the first set of bias signals at the second clock signal timing cell from a second bias circuit.

9. The method of claim 7, wherein adjusting the rising clock edge transition comprises adjusting the rate of the rising clock edge transition.

10. The method of claim 7, wherein adjusting the conductivity of the first transistor coupling the first inverter circuit to the supply voltage is based at least in part on a voltage of the first bias signal.

11. The method of claim 7, wherein adjusting the falling clock edge transition comprises adjusting the rate of the falling clock edge transition.

12. The method of claim 7, wherein adjusting the conductivity of the second transistor coupling the second inverter circuit to the reference voltage is based at least in part on a voltage of a complement of the first set of bias signals.

13. An apparatus comprising:
a bias circuit configured to receive a multi-bit signal and to provide a first set and a second set of bias signals based on the multi-bit signal;
a first bias controlled clock timing cell coupled to the bias circuit and configured to receive the first set of bias signals, the first bias controlled clock timing cell further configured to alter timing of a clock signal edge based on the first set of bias signals, the first bias controlled clock timing cell including a bias controlled inverter coupled in parallel with an inverter having weaker drive strength than the bias controlled inverter; and
a second bias controlled clock timing cell coupled in series with the first bias controlled clock timing cell, the second bias controlled clock timing cell further coupled to the bias circuit and configured to receive the second set of bias signals, the second bias controlled clock timing cell configured to alter timing of a different clock signal edge than the first bias controlled clock timing cell based on the second set of bias signals,
wherein the second set of bias signals is different than the first set of bias signals.

14. The apparatus of claim 13, wherein the bias controlled inverter is configured to have a drive strength adjusted by the multi-bit signal.

15. The apparatus of claim 13, wherein the clock signal edge is a rising clock edge and the different clock signal edge is a falling clock edge.

16. The apparatus of claim 13, wherein the multi-bit signal represents a multi-bit digital bias signal.

\* \* \* \* \*